(12) United States Patent
Sasaki

(10) Patent No.: US 7,514,636 B2
(45) Date of Patent: Apr. 7, 2009

(54) CIRCUIT COMPONENT MODULE, ELECTRONIC CIRCUIT DEVICE, AND METHOD FOR MANUFACTURING THE CIRCUIT COMPONENT MODULE

(75) Inventor: Yorihiko Sasaki, Miyagi-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 499 days.

(21) Appl. No.: 11/290,314

(22) Filed: Nov. 29, 2005

(65) Prior Publication Data

US 2006/0120056 A1   Jun. 8, 2006

(30) Foreign Application Priority Data

Dec. 6, 2004   (JP)   ............... 2004-352814

(51) Int. Cl.
*H05K 1/00*   (2006.01)
(52) U.S. Cl. ..................... 174/252; 257/777
(58) Field of Classification Search .......... 174/252, 174/260; 257/777
See application file for complete search history.

(56) References Cited

U.S. PATENT DOCUMENTS

| | | | |
|---|---|---|---|
| 6,038,133 A | 3/2000 | Nakatani et al. | |
| 7,365,273 B2 * | 4/2008 | Fairchild et al. | 174/260 |
| 2001/0006258 A1 * | 7/2001 | Hur | 257/777 |
| 2003/0045024 A1 | 3/2003 | Shimoto et al. | |
| 2003/0137045 A1 | 7/2003 | Sugaya et al. | |
| 2004/0145044 A1 | 7/2004 | Sugaya et al. | |
| 2005/0130413 A1 | 6/2005 | Shimoto et al. | |

FOREIGN PATENT DOCUMENTS

| | | |
|---|---|---|
| JP | 2000-269411 | 9/2000 |
| JP | 2001-358465 | 12/2001 |
| JP | 2002-198462 | 7/2002 |
| JP | 2003-174141 | 6/2003 |
| JP | 2003-289128 | 10/2003 |

OTHER PUBLICATIONS

Japanese Office Action dated Oct. 28, 2008 for Japanese Application No. 2004-352814.

* cited by examiner

*Primary Examiner*—Jeremy C Norris
(74) *Attorney, Agent, or Firm*—Beyer Law Group LLP

(57) ABSTRACT

A circuit component module includes a heat-releasing plate, a resin film stacked on a surface of the heat-releasing plate, an electronic component embedded in the first resin film and partially in contact with the heat-releasing plate, and a wiring pattern embedded in the surface of the first resin film opposite the heat-releasing plate. The wiring pattern forms a circuit in combination with the electronic component.

14 Claims, 8 Drawing Sheets

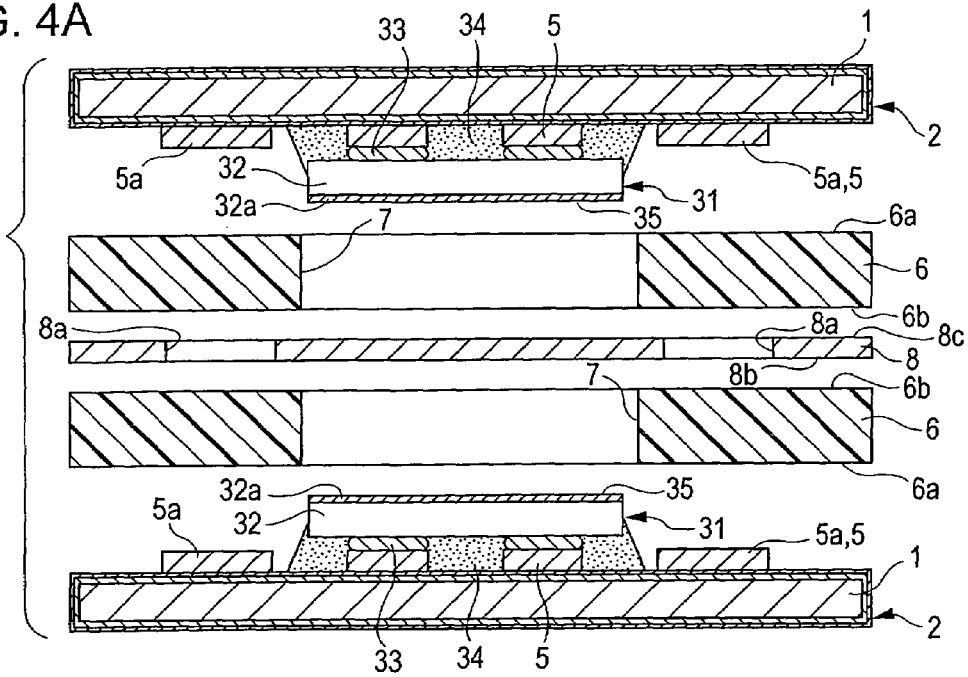
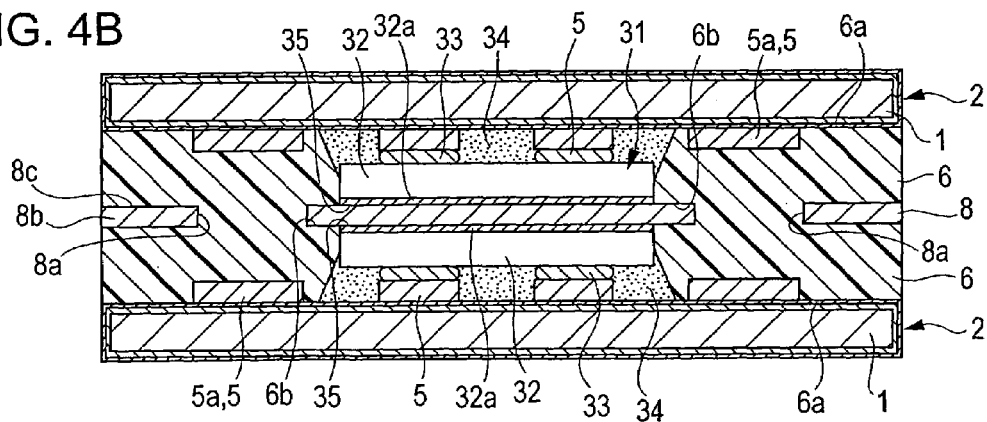
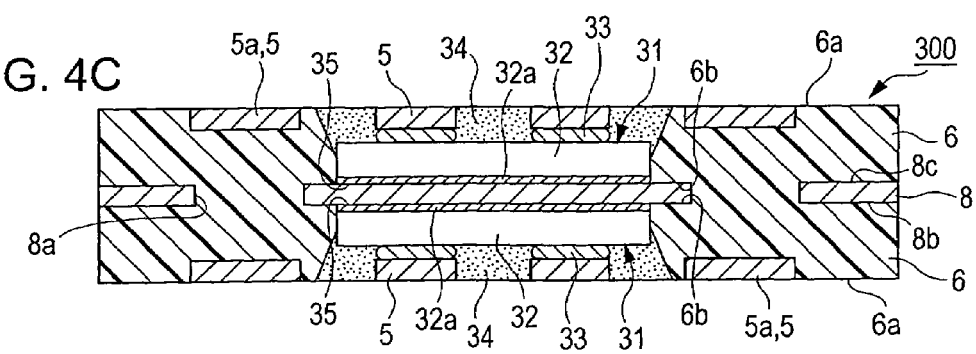

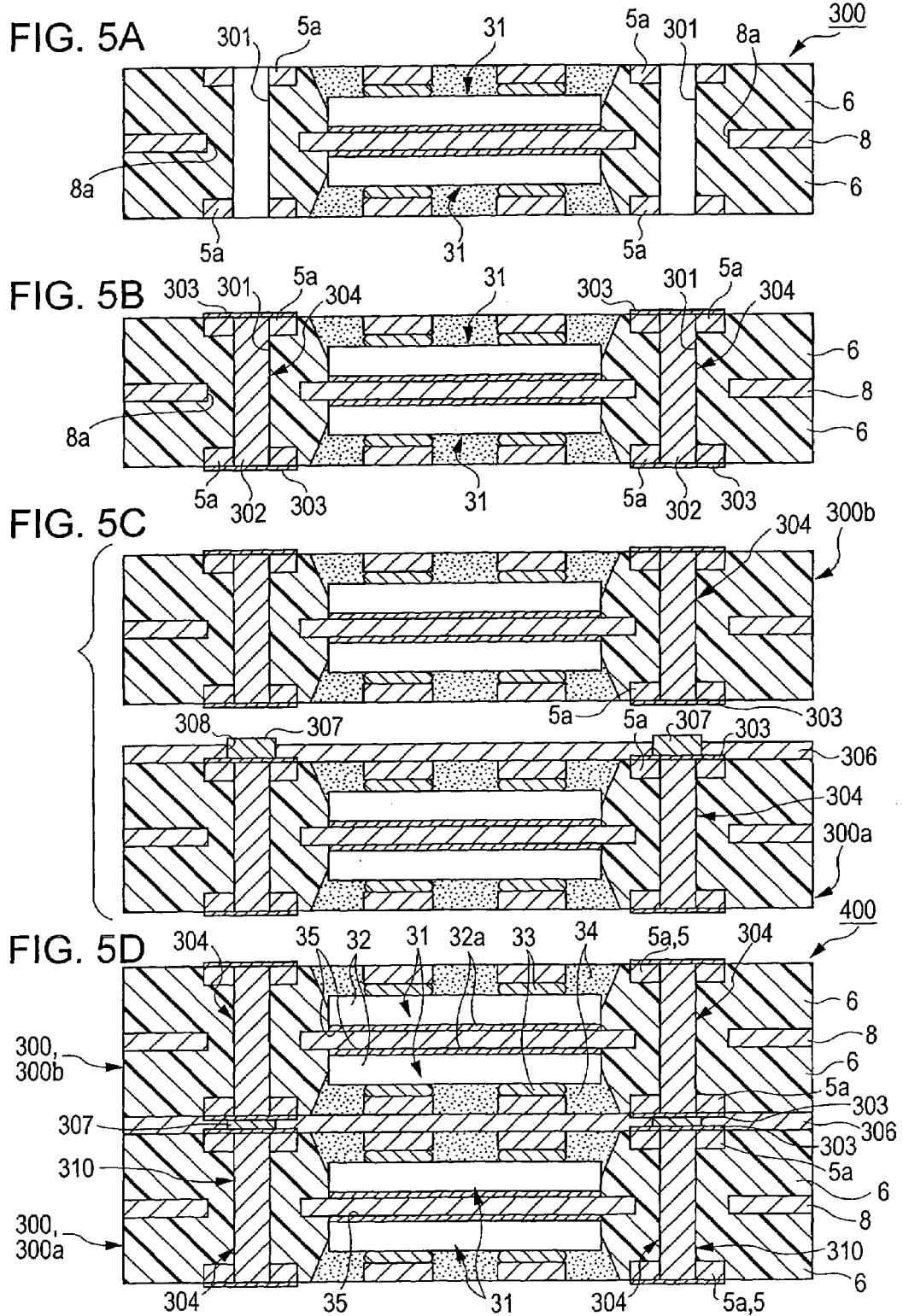

CIRCUIT COMPONENT MODULE, ELECTRONIC CIRCUIT DEVICE, AND METHOD FOR MANUFACTURING THE CIRCUIT COMPONENT MODULE

BACKGROUND OF THE INVENTION

1. Field of the Invention

The present invention relates to a circuit component module and an electronic circuit device, and to a method for manufacturing the circuit component module.

2. Description of the Related Art

Portable electronic devices, such as cellular phones and PDAs, are increasingly using sheet-like circuit component modules in which a circuit board and various components are integrated in order to reduce the size and weight and the cost. Such a circuit component module includes various components embedded in, for example, a resin base plate and an electroconductive circuit pattern formed on the surface, and is formed on an almost even flat plate, as disclosed in, for example, Japanese Unexamined Patent Application Publication Nos. 2001-358465 and 11-220262. Since the circuit component module thus can be small and lightweight and excels at mass production, it is suitable as a component circuit used in portable electronic devices, which are generally required to be small and lightweight.

The circuit component module disclosed in Japanese Unexamined Patent Application Publication No. 2001-358465 is produced by applying an organic polymer onto arranged components with, for example, a roll coater, firing the polymer, and subsequently forming contact-holes for wiring. This module therefore might not be able to maintain good precision in joining components disadvantageously because of uneven resin surfaces. In addition, resin residues on the chip pad are likely to cause continuity failures, or stress produced between a component and the resin is liable to give damage to their junction.

In the circuit component module disclosed in Japanese Unexamined Patent Application Publication No. 11-220262 as well, heat or stress applied in the manufacturing process is liable to give damage to junctions. Also, this process requires many steps for pattern alignment, consequently reducing the finished precision and increasing manufacturing cost.

Furthermore, if a power IC or another electronic component generating large amount of heat is used in a circuit component module, it must be taken into account how heat from the power IC is removed.

SUMMARY OF THE INVENTION

In view of the above disadvantages, the present invention provides a circuit component module that can be produced with high precision and reliability at low cost and a method for manufacturing the same. The present invention also provides an electronic circuit device from which heat generated from an electronic component generating a large amount of heat, such as a power IC, can be efficiently removed.

According to an aspect of the present invention, a circuit component module is provided which includes a heat-releasing plate, a first resin film stacked on a surface of the heat-releasing plate, an electronic component embedded in the first resin film and partially in contact with the heat-releasing plate, and a wiring pattern embedded in the surface of the first resin film opposite the heat-releasing plate. The wiring pattern forms a circuit in combination with the electronic component.

The present invention is also directed to a circuit component module unit. The circuit component module unit includes two circuit component modules and a second resin film. The first resin films of the circuit component modules oppose each other with the second resin film therebetween, and the three resin films are bonded together to be integrated.

The present invention is also directed to another circuit component module unit including two circuit component modules in which the heat-releasing plates of the circuit component modules oppose each other, so that the circuit component modules share the heat-releasing plates.

Each structure above, in which the electronic component and the wiring pattern are embedded in the first resin film, can protect the wiring pattern and achieve a thin circuit component module or circuit component module unit. In addition, such a structure can enhance the reliability of the connection between the electronic component and the wiring pattern. Furthermore, since the electronic component is in contact with the heat-releasing plate, heat generated by the operation of the electronic component can be released outside the circuit component module through the heat-releasing plate.

In the structure of the circuit component module unit in which the resin films of the circuit component modules oppose each other, the heat-releasing plates are positioned on the outer sides of the circuit component module unit. Consequently, the heat-releasing plates can be used as the armoring plates of the circuit component module unit. Also, by disposing the second resin film between the circuit component modules, the circuit component modules can be easily boded to each other.

In the structure of the circuit component module unit in which the heat-releasing plates of the circuit component modules oppose each other so that the circuit component modules share the heat-releasing plates as one body, the number of heat-releasing plates for each electronic component can be reduced and the structure of the circuit component module unit can be simplified.

Preferably, the electronic component includes a body having a heat-releasing portion exposed at the surface having the heat-releasing plate of the first resin film, and a terminal attached to the body at the opposite side to the heat-releasing plate and connected to part of the wiring pattern.

Since the heat-releasing portion of the electronic component is exposed at the surface having the heat-releasing plate, heat can be efficiently removed. Also, since the terminal of the electronic component is connected to the wiring pattern embedded in the first resin film, the reliability of the connection between the wiring pattern and the terminal can be enhanced.

In the circuit component module, the heat-releasing portion of the electronic component and the heat-releasing plate may be bonded to each other with a thermally conductive adhesive. Thus, the thermal conductivity can be enhanced between the electronic component and the heat-releasing plate and accordingly heat can be efficiently removed.

The first resin film may have at least one through-hole electrode formed of an electroconductive paste and connected to the wiring pattern. If a plurality of circuit component modules are stacked on top of one another to form a circuit component module unit, the through-hole electrode facilitates the interconnection of the wiring patterns, and the resulting circuit component module unit can have the respective functions of the circuit component modules.

The heat-releasing plate may have at least one pass-through hole through which the through-hole electrode extends. Thus, short circuits can be prevented between the through-hole electrode and the heat-releasing plate.

The electronic-component may be a power IC. Such a circuit component module can be used as a high-frequency module.

The present invention is also directed to an electronic circuit device including the circuit component module unit in which the first resin films oppose each other with the second resin film therebetween. In this electronic circuit device, the heat-releasing plates serve as armoring covers and grounding terminals.

The electronic circuit device can be thin because the circuit component module unit and be thin, and besides can increase the reliability of the connection between the electronic components and the wiring patterns. Also, since the electronic components are in contact with the respective heat-releasing plates, heat generated by the operation of the electronic components can be released to the outside of the electronic circuit device through the heat-releasing plates. In addition, since the heat-releasing plates serve as the armoring covers doubling as grounding terminals, they can block external radio waves for signals transmitted through the wiring pattern or a radiated electromagnetic field of the signals.

Furthermore, the heat-releasing plate, the first resin film, and the electronic component can be disposed with a high mutual dimensional precision, so that the circuit component module unit can exhibit its designed performance, particularly in use as a high-frequency module.

The present invention is also directed to another electronic circuit device that includes the circuit component module unit in which the heat-releasing plates oppose each other. The electronic circuit device also includes dielectric layers formed on the respective outer surfaces of the first resin films, and armoring covers disposed on the respective outer surfaces of the dielectric layers. The armoring covers double as grounding terminals.

In this structure, the distances from the armoring cover to the electronic component and to the wiring pattern can be controlled by varying the thickness of the dielectric layer. Thus, the electronic circuit device can exhibit its designed performance, particularly in use as a high-frequency module.

According to another aspect of the present invention, a method for manufacturing a circuit component module is provided which includes a mounting step, a stacking step, and a removal step. In the mounting step, a seed layer is formed over the entire surface of a base plate, and subsequently a wiring pattern including a plurality of wire portions is formed on the seed layer by plating. Then an electronic component is mounted on at least one of the wire portions. In the stacking step, a first resin film having a pass-through hole and a heat-releasing plate are stacked in that order on the wiring pattern and heat-pressed so that the wire portions are embedded in the first resin film and so that the electronic component is placed in the pass-through hole and bonded to the heat-releasing plate. In the removal step, the base plate and the seed layer are removed.

According to the method, the wiring pattern is embedded in the first resin film and the electronic component is placed in the pass-through hole. Consequently, the resulting circuit component module can be thin. Also, the electronic component is bonded to the heat-releasing plate. Consequently, the thermal conductivity can be enhanced between the electronic component and the heat-releasing plate.

The present invention is also directed to a method for manufacturing an electronic component module unit. In this method, two circuit component modules produced by the above method are prepared, and disposed in such a manner that the first resin films of the circuit component modules oppose each other. Then, a second resin film is disposed between the first resin films, and the circuit component modules and the second resin film are heat-pressed together.

In this method, the first resin films of the circuit component modules are opposed to each other, so that the heat-releasing plates are positioned on the outer sides of the circuit component module unit. Consequently, the heat-releasing plates can be used as armoring plates of the circuit component module unit. Also, by disposing the second resin film between the circuit component modules, the circuit component modules can be easily bonded to each other.

The present invention is also directed to a method for manufacturing an electronic component module unit. The method includes a mounting step, a stacking step, and a removal step. In the mounting step, a seed layer is formed over the entire surface of a base plate, and subsequently a wiring pattern including a plurality of wire portions is formed on the seed layer by plating. Then an electronic component is mounted on at least one of the wire portions. In the stacking step, first resin films, each having a pass-through hole are disposed on the respective surfaces of a heat-releasing plate, and a pair of the base plates having the wiring pattern and the electronic component are disposed on the respective first resin films with the wiring patterns opposing the first resin films. Then, the stack is heat-pressed, so that the wire portions are embedded in the first resin films and so that the electronic components are placed in the respective pass-through holes and bonded to the heat-releasing plate. In the removal step, the base plates and the seed layers are removed.

According to this method, the wiring pattern is embedded in the first resin film and the electronic component is placed in the pass-through hole. Consequently, the resulting circuit component module can be thin. Also, the electronic component is bonded to the heat-releasing plate in the method. Consequently, the thermal conductivity can be enhanced between the electronic component and the heat-releasing plate. Furthermore, since both surfaces of heat-releasing plate are bonded to the respective electronic components, the number of heat-releasing plates for each electronic component can be reduced. This reduces the number of parts and thus simplifies the manufacturing process.

The present invention provides a circuit component module that can be produced with high precision and reliability at low cost and a method for manufacturing the same. The present invention also provides an electronic circuit device from which heat generated from an electronic component generating a large amount of heat, such as a power IC, can be efficiently removed.

BRIEF DESCRIPTION OF THE DRAWINGS

FIGS. 4A to 4C are schematic sectional views illustrating a process for manufacturing a circuit component module unit according to a second embodiment of the present invention;

FIGS. 5A to 5D are schematic sectional views illustrating a process for manufacturing a circuit component module unit according to the second embodiment of the present invention;

DESCRIPTION OF THE PREFERRED EMBODIMENTS

First Embodiment

A circuit component module according to a first embodiment of the present invention and a method for manufacturing the same will now be described with reference to the drawings.

In the present embodiment, the method for manufacturing a circuit component module includes the mounting step of forming a seed layer and a wiring pattern on a base plate and mounting an electronic component on the base plate; the stacking step of stacking a first resin film and a heat-releasing plate on the base plate; and the removal step of removing the base plate and the seed layer.

In the mounting step, a seed layer is deposited on a base plate, and a wiring pattern is formed on the seed layer. Subsequently, an electronic component is mounted on the wiring pattern. In the stacking step, a first resin film having a pass-through hole and a heat-releasing plate are stacked on the base plate so that the electronic component is housed in the pass-through hole. In the removal step, the base plate and the seed layer are removed from the first resin film.

These steps will be described in detail below with reference to the drawings. FIGS. 1A to 1F illustrate the mounting step, and FIGS. 2A to 2C illustrate the stacking step and the removal step. The drawings referred to in the present embodiment are intended to illustrate the circuit component module and its manufacturing method, but do not necessarily correctly show its dimensional proportions according to the dimensions of the circuit component module used in practice.

Figure 1A:
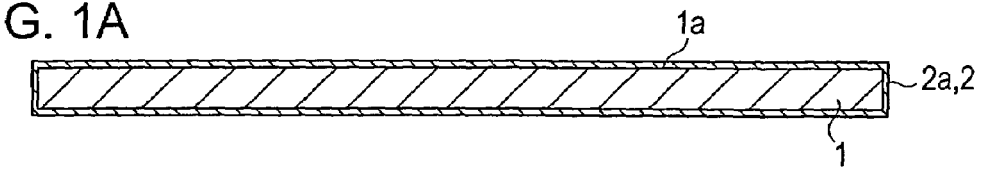
FIGS. 1A to 1F are schematic sectional views illustrating a process for manufacturing a circuit component module according to a first embodiment of the present invention.
Figure 1B:
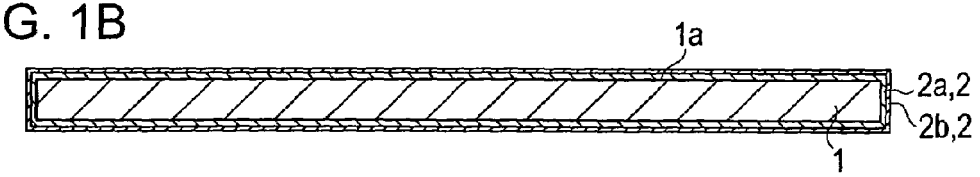
Figure 2A:
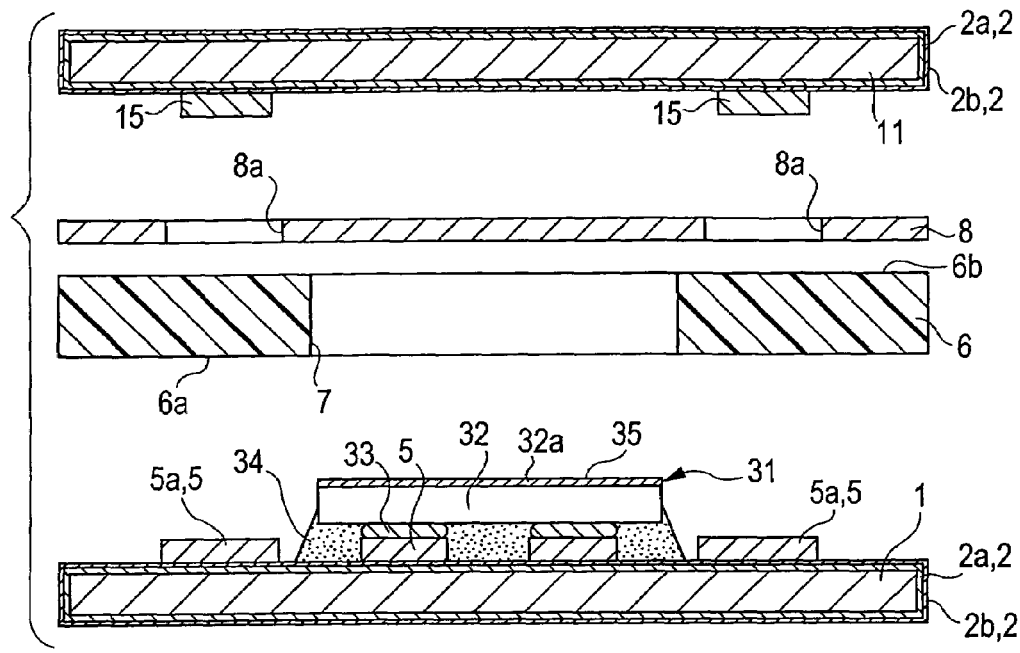
FIGS. 2A to 2C are schematic sectional views illustrating a process for manufacturing the circuit component module according to the first embodiment of the present invention.
Figure 2B:
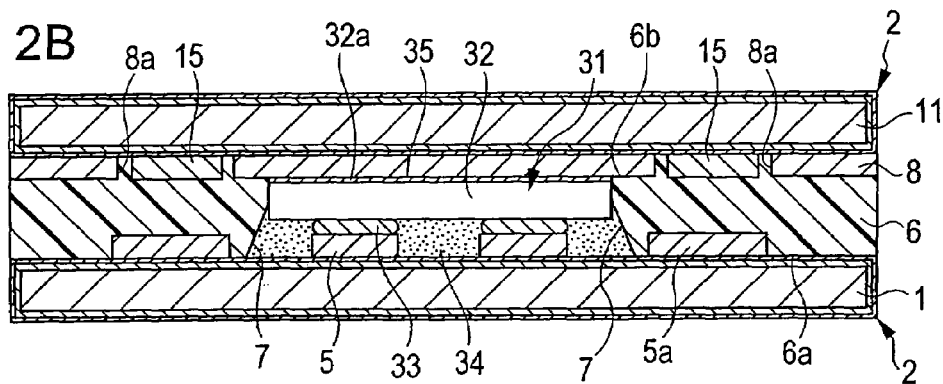
Figure 2C:
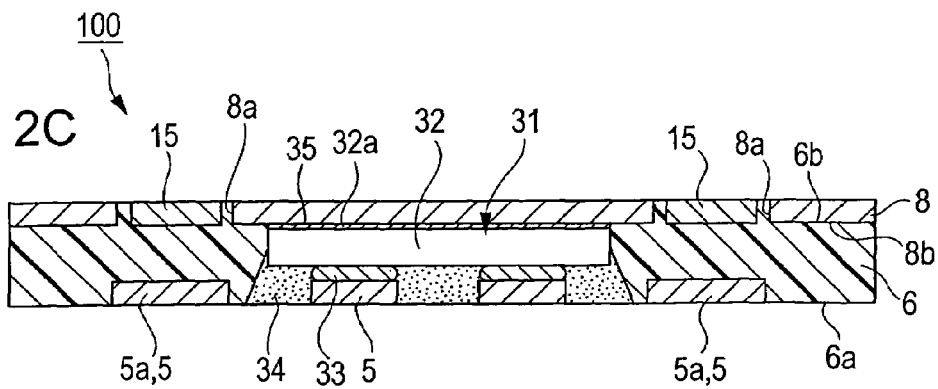

Mounting Step:

First, a first base plate 1 shown in FIG. 1A is prepared. Then, a seed layer 2 is formed to coat all the surfaces of the first base plate 1, as shown in FIGS. 1A and 1B. The seed layer 2 may have a multilayer structure including, for example, a zinc oxide layer 2a with a thickness of about 50 nm or 500 nm and a metallic copper layer 2b with a thickness of about 2 μm. By coating all the surfaces of the first base plate 1 with the seed layer 2, the first base plate 1 can be easily separated from the wiring pattern, as described below. The zinc oxide layer 2a can be formed by, for example, electroless plating in a plating bath containing zinc oxide. The metallic copper layer 2b can also be formed by electroless plating. The seed layer 2 may be formed only over a surface of the first base plate 1.

All the surfaces of the first base plate 1 are preferably made of oxide silicon from the viewpoint of enhancing the adhesion to the zinc oxide layer 2a of the seed layer and reusing the first base plate 1. Examples of the first base plate 1 include glass plates mainly containing silicon oxide, silicon base plates whose all surfaces are coated with a silicon oxide layer by thermal oxidation or thermal CVD, and resin or dielectric base plates whose all surfaces are coated with a silicon oxide layer by sputtering or the like. The silicon base plate may be doped with a dopant, such as B, P, or As. The resin base plate may be flexible. Since a long flexible resin base plate can be wound to a roll, it is suitable for continuous production and can increase productivity. The thickness of the first base plate 1 is not particularly limited, but is, for example, in the range of 30 μm to 3 mm.

Preferably, the first base plate 1 is hard. A hard base plate can serve as a backing plate of the wiring pattern when an electronic component is embedded in the first resin film in the below-described stacking step. Thus, the wiring pattern can be prevented from being deformed by stress produced by embedment.

Figure 1C:
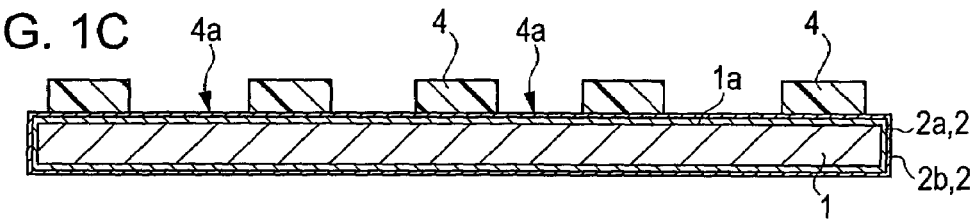

Turning to FIG. 1C, a patterned resist layer 4 (resist pattern) having a plurality of resist-removed regions 4a is formed on the seed layer 2. Specifically, a photosensitive resin film or dry film resist (hereinafter referred to as the resist layer) with a thickness of about 10 μm is deposited on the seed layer 2. The resist layer is exposed through a mask, followed by development, thereby forming the resist-removed regions 4a according to the mask pattern. Thus, the patterned resist layer 4 having the resist-removed regions 4a is formed.

After the formation of the patterned resist layer 4, the residue of the photosensitive resin film or dry film resist can remain on the resist-removed regions 4a. This remaining residue can cause the wiring pattern formed a subsequent step to break, or degrade the adhesion between the wiring pattern and the seed layer 2 to result in a problem in a subsequent pressing step or a separation step. In order to completely remove the residue, preferably, the resist-removed regions 4a are irradiated with argon plasma or the surface of the seed layer 2 exposed at the resist-removed regions 4a is slightly etched, after the formation of the patterned resist layer 4. Irradiation of argon plasma is preferably performed, for example, at a plasma power of about 500 W, an ambient pressure of 10 Pa or less, an argon flow rate of 50 sccm, and an irradiation time of 30 seconds. Etching of the seed layer is preferably performed by treatment in an etchant of 10% acetic acid solution for 30 seconds. Such treatment can increase the adhesion between the seed layer 2 and the wiring pattern to 3 N/cm or more.

Figure 1D:
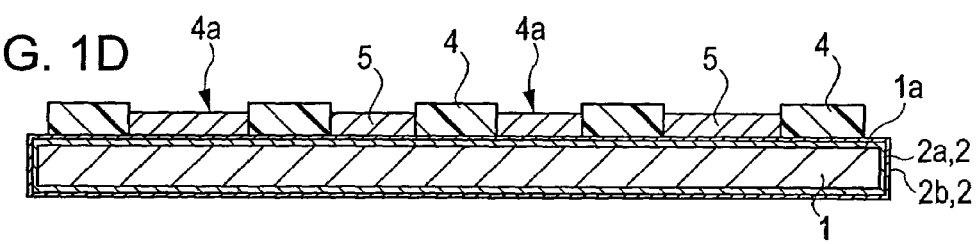

Turning to FIG. 1D, a Cu wiring pattern (wire portions) 5 is formed in the resist-removed regions 4a by plating. Specifically, a plating solution containing, for example, copper sulfate, is brought into contact with the seed layer 2 exposed in the resist-removed regions 4a and a direct current is applied to the seed layer 2 to form a Cu plating layer. Preferably, the thickness of the wiring pattern 5 is lower than that of the patterned resist layer 4, and is for example about 5 μm.

Figure 1E:
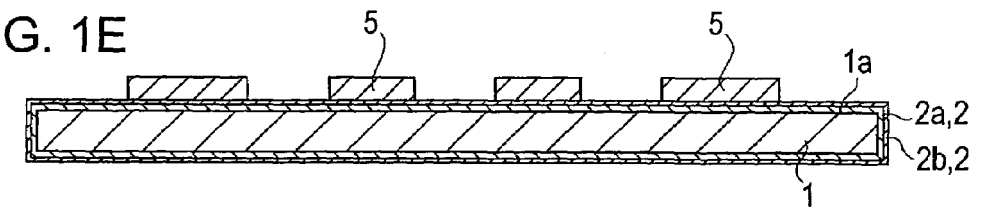

Turning then to FIG. 1E, the patterned resist layer 4 is removed by wet etching. The seed layer 2 and the wiring pattern 5 are thus formed on the first base plate 1.

Figure 1F:
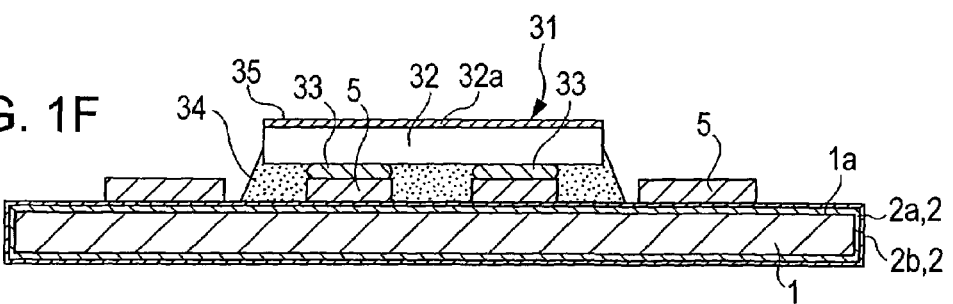

Then, a power IC 31 (electronic component) is mounted on the wiring pattern 5, as shown in FIG. 1F. The power IC 31 includes an IC body (component body) 32 having a heat-releasing portion and ball bumps 33 (terminals) made of, for example, gold provided at the bottom of the IC body 32. The IC body 32 contains a power IC element. The upper surface of the IC body 32 serves as the heat-releasing portion 32a for releasing heat generated from the power IC element to the outside of the IC body.

The mounting of the power IC 31 is performed by pressing the ball bumps 32 on the wiring pattern 5. After the mounting, the spaces defined by the wiring pattern 5 and the IC body 32 are filled with a sealant 34. The sealant 34 may be an epoxy resin or the like. Further, a thermally conductive adhesive 35 is applied onto the heat-releasing portion 32a of the power IC. The thermally conductive adhesive 35 may be an epoxy adhesive containing alumina or aluminium nitride filler.

Stacking Step:

Turning to FIG. 2A, a first resin film 6 having a pass-through hole 7 and a heat-releasing plate 8 are prepared. Another base plate, or a second base plate 11, is also prepared. The second base plate 11 is coated with a seed layer 2 and provided with a wiring pattern 15 on the seed layer 2.

The pass-through hole 7 in the first resin film 6 may have a shape of a circle, an ellipse, a triangle, a rectangle, or any other polygon when viewed from above. The pass-through hole 7 is formed to a size capable of housing the power IC 31. The formation of the pass-through hole 7 can be performed by, for example, punching with a die or laser processing. The first resin film 6 may be a thermoplastic resin plate with a thickness of about 50 µm, such as that of epoxy or polyester, or a glass epoxy plate with a thickness of about 50 µm.

The heat-releasing plate 8 may be a thermally conductive metal plate, such as that of Cu or Al. The thickness of the heat-releasing plate 8 is preferably about 0.02 to 0.2 mm. Preferably, the heat-releasing plate 8 has pass-through holes 8a for through-hole electrodes, as shown in FIG. 2A.

Then, the first resin film 6 and the heat-releasing plate 8 are stacked on the base plate 1 in that order, and further the second base plate 11 is disposed on the heat-releasing plate 8. When the first resin film 6 is set, the positions of the first resin film 6 and the base plate 1 are adjusted so that the first power IC 31 on the first base plate 1 is aligned with the pass-through hole 7 in the first resin film 6. When the heat-releasing plate 8 is set, the positions of the heat-releasing plate 8 and the first base plate 1 are adjusted so that the wire portions 5a of the wiring pattern 5 on the first base plate 1 not connected to the power IC 31 are aligned with the pass-through holes 8a in the heat-releasing plate 8. When the second base plate 11 is set, the positions of the second base plate 11 are adjusted so that the wire portions of the wiring pattern 15 of the second base plate 11 are aligned with the pass-through holes 8a in the heat-releasing plate 8.

Turning then to FIG. 2B, the first base plate 1, the first resin film 6, the heat-releasing plate 8, and the second base plate 11 are stacked together and heat-pressed. In the heat press, the first resin film 6 is deformed by the wiring pattern 5, so that the wiring pattern 5 is embedded in one surface 6a of the first resin film 6. At the same time, the power IC 31 is placed in the pass-through hole 7 in the first resin film 6. The first resin film 6 is deformed into a thin plate by being pressed in its thickness direction. Consequently, part of the first resin film 6 is squeezed to fill the space defined by the pass-through hole 7 and the power IC 31, as shown in FIG. 2B. Thus, the power IC 31 is embedded in the first resin film 6 completely. The heat-releasing portion 32a of the power IC 31 is exposed at the other surface 6b of the first resin film 6 by the placement of the power IC 31 in the pass-through hole 7.

In addition, the heat-releasing plate 8 and the first resin film 6 are bonded together by the heat press. At this time, the heat-releasing portion 32a exposed at the surface 6b of the first resin film 6 is bonded to the heat-releasing plate 8 with a thermally conductive adhesive 35.

Furthermore, the heat press allows the wiring pattern 15 of the second base plate 11 to be placed in the pass-through holes 8a in the heat-releasing plate 8. The pass-through holes 8a are further filled with part of the first resin film 6 squeezed by deformation of the first resin film 6. The first resin film filling the pass-through holes 8a insulates the heat-releasing plate 8 from the wiring pattern 15.

The temperature of the heat press depends on the material of the first resin film 6, but is preferably in the range of 140 to 180° C. The pressure of the heat press is preferably about 15 to 25 Pa. The press time is preferably about 30 to 50 minutes. The wiring pattern 5 and the power IC 31 are thus embedded in the first resin film 6.

Removal Step:

Turning now to FIG. 2C, stresses are applied between the base plates 1 and 11 and the first resin film 6 and between the base plate and the heat-releasing plate 8 to remove the base plates 1 and 11. At this point, the base plates 1 and 11 are separated from their respective seed layers 2, and the seed layers 2 with the wiring pattern 5 or 15 are transferred to the first resin film 6 and the heat-releasing plate 8. The transferred seed layers 2 are removed by wet etching using, for example, a persulfuric acid solution as an etchant. The removed base plates 1 and 11 can be recycled if the seed layer 2 remaining on the base plate is removed with an acid or an alkali.

The separation of the base plate 1 from the seed layer 2 probably occurs through the following mechanism.

When, for example, the first base plate 1 is separated from the first resin film 6, tensile stresses are placed on the seed layer 2 in its thickness directions. At this time, the stress toward the first resin film 6 is higher than that toward the base plate because the metallic copper layer of the seed layer 2 is bonded to the wiring pattern 5 that is embedded in and tightly bonded to the first resin film 6. Thus, the seed layer 2 with the wiring pattern 5 can be transferred to the first resin film 6. Also, the wiring pattern 5a pulls the metallic copper layer 2b of the seed layer 2 during the separation, consequently placing a shearing stress on the metallic copper layer 2b. However, the metallic copper layer 2b is backed with the zinc oxide layer 2a. Accordingly, the metallic copper layer 2b is not likely to be torn and can be completely separated together with the zinc oxide layer 2a from the base plate 1. Also, the zinc oxide layer 2a has a thickness of about 50 to 500 nm so as to have a high strength, and it cannot be torn accordingly. Thus the zinc oxide layer can be completely separated from the base plate 1.

The same mechanism is produced between the second base plate 11 and the first resin film 6 filling the pass-through holes 8a in the heat-releasing plate 8, thereby separating the second base plate 11 from the seed layer 2.

The wiring patterns 5 and 15 are slightly etched when the seed layers 2 is removed by etching, but to the extent that the width of the wire portions of the wiring patterns 5 and 15 is not reduced. This is because the wiring patterns 5 and 15 are protected by the first resin film 6 in such a manner that major part of the wiring patterns 5 and 15 are buried in the first resin film 6 with small exposed areas. Since the wiring patterns 5 and 15 are thus protected by the first resin film 6, they are prevented from being corroded by the etchant, and thus their wire portions can be prevented from decreasing in width. Consequently, a line-and-space (L/S) pattern of 10 µm/10 µm can be achieved which cannot be achieved by known transfer methods.

The circuit component module 100 is thus produced.

In the manufacturing method described above, by embedding the wiring patterns 5 and 15 in the first resin film 6 while the power IC 31 is housed in the pass-through hole 7, the thickness of the circuit component module 100 can be reduced. By bonding the power IC 31 to the heat-releasing plate 8, the thermal conductivity can be enhanced between the power IC 31 and the heat-releasing plate 8.

Circuit Component Module:

The circuit component module 100 shown in FIG. 2C includes the heat-releasing plate 8, the first resin film 6 disposed on one surface 8b of the heat-releasing plate 8, the power IC (electronic component) 31 embedded in the first resin film 6 and partially connected to the heat-releasing plate 8, and the wiring pattern 5 embedded in the surface 6a of the first resin film 6 opposite the heat-releasing plate 8 to form a circuit in combination with the power IC 31. The heat-releasing plate 8 has the pass-through holes 8a and wire portions of the wiring pattern 15 are placed in the pass-through holes 8a. The spaces defined by the pass-through holes 8a and the wire portions of the wiring pattern 15 are filled with part of the first resin film 6. The heat-releasing plate 8 may be joined to another heat-releasing member (not shown) or exposed to the ambient atmosphere outside the circuit component module 100.

The power IC 31 includes the IC body (component body) 32 having the heat-releasing portion 32a and the ball bumps (terminals) 33 attached to the IC body 32. The IC body 32 contains a power IC element (not shown). The heat-releasing portion 32a is exposed at the surface 6b having the heat-releasing plate of the first resin film 6, and the terminals 33 are attached to the IC body at the opposite side to heat-releasing plate 8 and connected to part of the wiring pattern 5. The heat-releasing portion 32a is bonded to the heat-releasing plate 8 with the thermally conductive adhesive 35.

This structure allows heat generated by the operation of the power IC element to be transmitted to the heat-releasing portion 32a through the inside of the IC body 32. The heat is further conducted from the heat-releasing portion 32a to the heat-releasing plate 8 through the thermally conductive adhesive 35. The heat reaching the heat-releasing plate 8 may be further conducted to another heat-releasing member, or released by the heat-releasing plate 8.

In the circuit component module 100, heat generated by the operation of the power IC 31 can be released to the outside of the circuit component module 100 through the heat-releasing plate 8 because the power IC 31 is in contact with the heat-releasing plate 8. In addition, the structure in which the power IC 31 and the wiring patterns 5 and 15 are embedded in the first resin film 6 can protect the wiring patterns 5 and 15 and lead to a thin circuit component module 100. The structure can also ensure the connection between the power IC 31 and the wiring pattern 5.

Method for Manufacturing a Circuit Component Module Having a Through-Hole Electrode:

A method for manufacturing a circuit component module will now be described in which the circuit component module 100 shown in FIG. 2C is further processed to have a through-hole electrode.

Figure 3A:
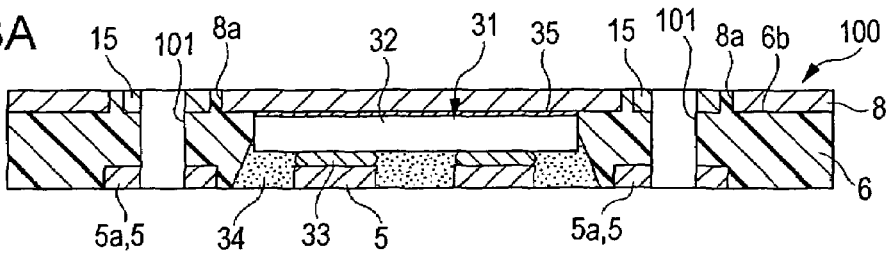
FIGS. 3A to 3D are sectional views illustrating a process for forming two circuit component modules.

First, pass-through holes 101 for through-hole electrodes are formed in the circuit component module 100. These pass-through holes 101 run through the first resin film 6 and also run through the wire portions of the wiring pattern 15 housed in the pass-through holes 8a in the heat-releasing plate 8 and the wire portions 5a of the wiring pattern 5 not connected to the power IC 3, as shown in FIG. 3A.

Figure 3B:
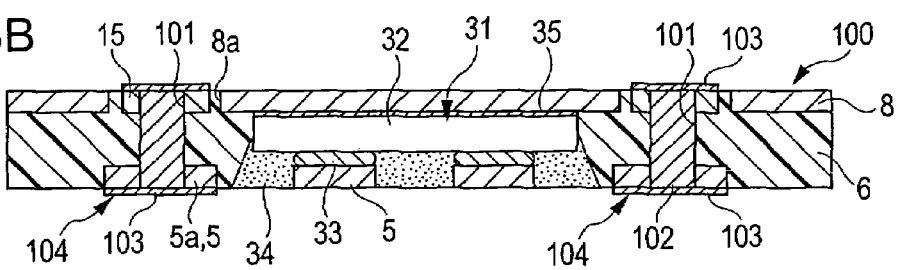
Figure 3C:
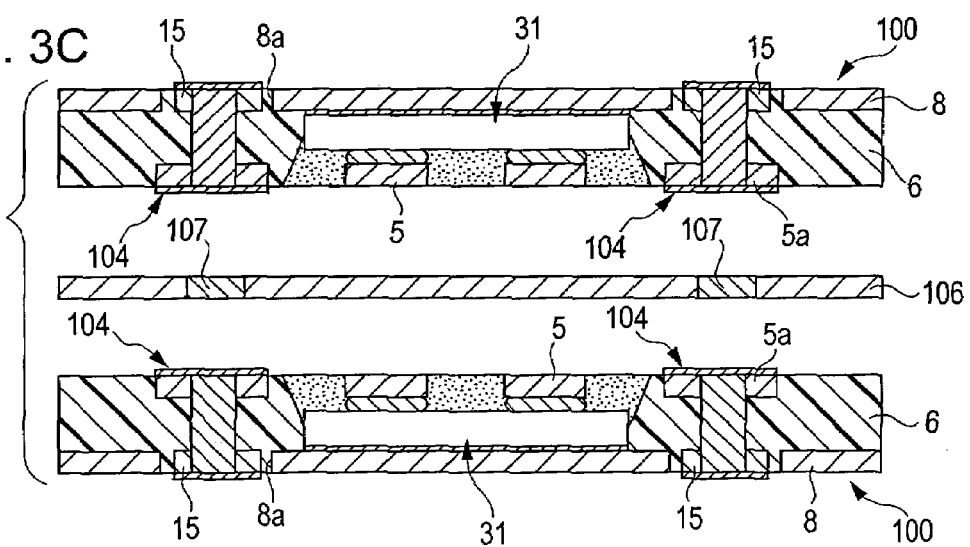

Turning then to FIG. 3B, the pass-through holes 101 are filled with an electroconductive paste 102 and plating cover films 103 are formed to close the pass-through holes 101. The plating cover films 103 are made of, for example, Cu. Through-hole electrodes 104 are each thus formed of the electroconductive paste 102 and the plating cover films 103. The through-hole electrodes 104 connect the wiring pattern 15 on the heat-releasing plate side and the wiring pattern 5 on the other side.

Method for Manufacturing a Circuit Component Module Unit (Electronic Circuit Device) Including a Plurality of Circuit Component Modules:

Two circuit component modules 100, each having the through-hole electrodes 104 are prepared. In this instance, the circuit component modules 100 are set such that the first resin films 6 oppose each other. In addition, another second resin film, or a second resin film 106, with a thickness of about 20 to 50 μm is disposed between the circuit component modules 100. Portions of the second resin film 106 opposing the through-hole electrodes 104 of the circuit component modules 100 are filled with an electroconductive paste to define electroconductive paste portions 107. The second resin film 106 is made of a thermoplastic resin, such as an epoxy resin or a polyester resin.

Figure 3D:
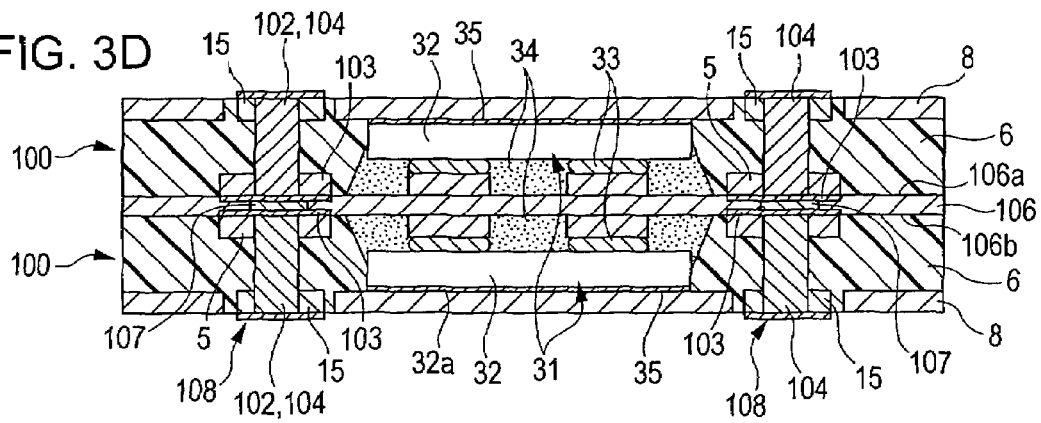

Turning to FIG. 3D, the circuit component modules 100 and the second resin film 106 are stacked together and heat-pressed. The first resin films 6 of the circuit component modules 100 are bonded to the respective surfaces 106a and 106b of the second resin film 106 by the heat press. At the same time, the plating cover films 103 of the through-hole electrodes 104 are bonded to the electroconductive paste portions 107 of the second resin film 106. The through-hole electrodes 104 and the electroconductive paste portions 107 thus form through-hole electrodes 108, each connecting the wiring patterns 5 and 15 of the circuit component modules 100. A circuit component module unit 200 is thus completed as shown in FIG. 3D.

In the manufacturing method described above, by opposing the first resin films 6 to each other, the heat-releasing plates 8 of the circuit component modules 100 are positioned on the outer sides of the resulting circuit component module unit 200. Consequently, the heat-releasing plates 8 can be used as the armoring plates of the circuit component module unit 200. Also, the second resin film 106 between the circuit component modules 100 facilitates the bonding between the circuit component modules 100.

Circuit Component Module Unit (Electronic Circuit Device) Including Two Circuit Component Modules:

The circuit component module unit 200 shown in FIG. 3D includes two circuit component modules 100 shown in FIG. 2C. The circuit component modules 100 are disposed such that their first resin films 6 oppose each other with the second resin film 106 therebetween, and these three resin films are bonded together to be integrated. Since the first resin films 6 are opposed to each other, the heat-releasing plates 8 are positioned outside the circuit component module unit 200. Thus, the heat-releasing plates 8 can serve as the armoring plates of the circuit component module unit 200.

The resin films 6 and 106 have through-hole electrodes 108 formed of the electroconductive paste 102 and the electroconductive paste portion 107, connected to the wiring patterns 5 and 15. This structure facilitates the interconnection between the power ICs 31 of the circuit component modules 100 and the wiring patterns 5 and 15.

The circuit component module unit 200 shown in FIG. 3D can be used as an electronic circuit device including two power ICs 31. This electronic circuit device has heat-releasing plates 8 doubling as armoring plates that block external radio waves for signals transmitted through the wiring patterns 5 and 15 or a radiated electromagnetic field of the signals. In the circuit component module 100, the heat-releasing plate 8, the first resin film 6, and the power IC 31 are disposed with a high mutual dimensional precision, so that the circuit component module 100 can exhibit its designed performance, particularly in use as a high-frequency module.

Second Embodiment

A circuit component module unit and its manufacturing method according to a second embodiment of the present invention will now be described. FIGS. 4A to 4C show a stacking step and a removal step of the method. The drawings referred to in the present embodiment are intended to illustrate the circuit component module and its manufacturing method, but do not necessarily correctly show its dimensional proportions according to the dimensions of the circuit component module unit used in practice.

Method for Manufacturing a Circuit Component Module Unit:

First, two base plates 1, two first resin films 6, and heat-releasing plate 8 are prepared as shown in FIG. 4A.

The base plate 1, which is the same as in the first embodiment, is coated with the seed layer 2 and has a wiring pattern 5 and the power IC 31. The first resin film 6 is a thermoplastic resin or glass epoxy plate with a thickness of about 100 to 500 μm, and has a pass-through hole 7. The heat-releasing plate 8 is a thermally conductive metal plate, such as Al, with a thickness of about 100 μm, and has a plurality of pass-through holes 8a.

As shown in FIG. 4A, the resin films 6 are disposed along the respective surfaces 8b and 8c of the heat-releasing plate 8, and the base plates 1 are disposed along the respective outer surfaces of the first resin films 6, that is, the surfaces opposite the heat-releasing plate 8. The positions of the base plates 1 are adjusted so that the power ICs 31 are aligned with the pass-through holes 7 of the first resin films 6, and so that the wire portions 5a of the wiring patterns 5 not connected to the power ICs 31 are aligned with the pass-through holes 8a in the heat-releasing plate 8.

Turning to FIG. 4B, the base plates 1, the first resin films 6, and the heat-releasing plate 8 are stacked together and heat-pressed. At this point, the first resin films 6 are deformed by the wiring patterns 5, so that the wiring patterns 5 are each embedded in one surface 6a of the corresponding first resin film 6. At the same time, the power ICs 31 are embedded in the respective pass-through holes 7 in the first resin films 6. The first resin films 6 are deformed into thin plates by being pressed in their thickness direction. Consequently, part of the resin films 6 are squeezed to fill the space defined by the pass-through holes 7 and the power ICs 31, as shown in FIG. 4B. Thus, the power ICs 31 are embedded in the first resin films 6 completely. The heat-releasing portion 32a of each power IC 31 is exposed at the other surface 6b of the corresponding first resin film 6 by the placement of the power ICs 31 in the pass-through hole 7.

In addition, the heat-releasing plate 8 and the first resin films 6 are bonded together by the heat press. At this time, part of the first resin films 6 are squeezed to fill the pass-through holes 8a of the heat-releasing plate 8. Further, the heat-releasing portions 32a of the power ICs 32 exposed at the surfaces 6b of the first resin films 6 are each connected to the heat-releasing plate 8 with the thermally conductive adhesive 35.

Turning then to FIG. 4C, stresses are applied between the base plates 1 and the first resin films 6 to remove the base plates 1. At this point, the base plates 1 are separated from their respective seed layers 2, and the seed layers 2 with the wiring patterns 5 are transferred to the first resin films 6. The transferred seed layers 2 are removed by wet etching.

The circuit component module unit 300 according to the present invention is thus completed.

Circuit Component Module Unit:

The circuit component module unit 300 shown in FIG. 4C includes the heat-releasing plate 8, a pair of resin films 6 stacked on the surfaces 8b and 8c of the heat-releasing plate 8, the power ICs 31 embedded in the respective resin films 6 and partially in contact with the heat-releasing plate 8, and the wiring patterns 5 embedded in the surfaces 6a of the first resin films opposite the heat-releasing plate 8 and forming circuits in combination with the power ICs 31. The heat-releasing plate 8 may be connected to another heat-releasing member or exposed to an ambient atmosphere outside the circuit component module, as in the first embodiment.

In the circuit component module unit 300, heat generated by the operation of the power ICs 31 can be released to the outside of the circuit component module unit 300 through the heat-releasing plate 8 because of each power IC 31 is in contact with the heat-releasing plate 8. In addition, the structure in which the power ICs 31 and the wiring patterns 5 are embedded in the first resin films 6 can protect the wiring patterns 5 and lead to a thin circuit component module unit 300. The structure can also ensure the connection between the power ICs 31 and the wiring patterns 5. Furthermore, the structure in which both surfaces 8b and 8c of the heat-releasing plate 8 are bonded to the respective power ICs 31 makes it possible to reduce the number of heat-releasing plates 8 for each power IC 31 and can achieve a simplified structure.

Method for Manufacturing a Circuit Component Module Unit (Electronic Circuit Device) Including a Plurality of Circuit Component Modules:

A method for manufacturing a circuit component module unit (electronic circuit device) will now be described in which the circuit component module unit 300 shown in FIG. 4C is further processed so as to have a plurality of circuit component modules.

First, pass-through holes 301 for through-hole electrodes are formed in the circuit component module unit 300, as shown in FIG. 5A. These pass-through holes 301 run through the resin films 6 and the pass-through holes 8a in the heat-releasing plate 8, and also run through the wire portions 5a of the wiring patterns 5 not connected to the power ICs 31.

Turning to FIG. 5B, the pass-through holes 301 are filled with an electroconductive paste 302 and plating cover films 303 are formed to close the pass-through holes 301. Through-hole electrodes 304 are each thus formed by the electroconductive paste 302 and the plating cover films 303. The through-hole electrodes 304 connect the wire portions 5a of the wiring patterns 5 in the surfaces of the first resin films opposite the heat-releasing plate 8.

Turning then to FIG. 5C, two circuit component module units 300a and 330b having the through-hole electrodes 304 shown in FIG. 5B are prepared. In this instance, a second resin film 306 is stacked on one of the circuit component module units 300a and 330b (on the circuit component module unit 300a, in the figure) in advance. The second resin film 306 has pass-through holes 308 that are filled with an electroconductive paste to define electroconductive paste portions 307. The electroconductive paste portions 307 are aligned with the through-hole electrodes 304. The through-hole electrodes 304 of the other circuit component module unit 300b are also aligned with the electroconductive paste portions 307.

Turning then to FIG. 5D, the circuit component modules 300a and 300b are stacked together and heat-pressed. The circuit component module units 300a and 300b are bonded to each other by the heat press with the second resin film 306 therebetween. At the same time, the plating cover films 303 of the through-hole electrodes 304 in the circuit component module units 300a and 300b are bonded to the electroconductive paste portions 307 of the second resin film 306. The through-hole electrodes 304 and the electroconductive paste portions 307 thus form through-hole electrodes 310, each mutually connecting the wire portions 5a of the wiring patterns 5 of the circuit component modules 300a and 300b. Another circuit component module unit 400 is thus completed according to the present embodiment.

Circuit Component Module Unit (Electronic Circuit Device) Including Two Circuit Component Module Units:

The circuit component module unit 400 shown in FIG. 5D includes two circuit component module units 300 shown in FIG. 4C and the second resin film 306 disposed between the circuit component module units 300, and the circuit component module units 300 and the second resin film 306 are bonded together to be integrated. The second resin film 306 has the pass-through holes 308 that are filled with the electroconductive paste to define the electroconductive paste portions 307. Each electroconductive paste portion 307 is connected to the corresponding through-hole electrodes 304, so that the power ICs 31 of the circuit component modules 30 and the wiring patterns 5 are connected to each other.

The circuit component module unit 400 shown in 5D can be used as an electronic circuit device including four power ICs 31. This electronic circuit device has two heat-releasing plates 8 for the four power ICs 31. Thus, the number of heat-releasing plates 8 for each power IC 31 can be reduced and consequently the structure can be simplified. In the circuit component module unit 400, the heat-releasing plates 8, the first and second resin films 6 and 306, and the power ICs 31 are disposed with a high mutual dimensional precision, so that the circuit component module unit 400 can exhibit its designed performance, particularly in use as a high-frequency module.

Third Embodiment

Figure 6:
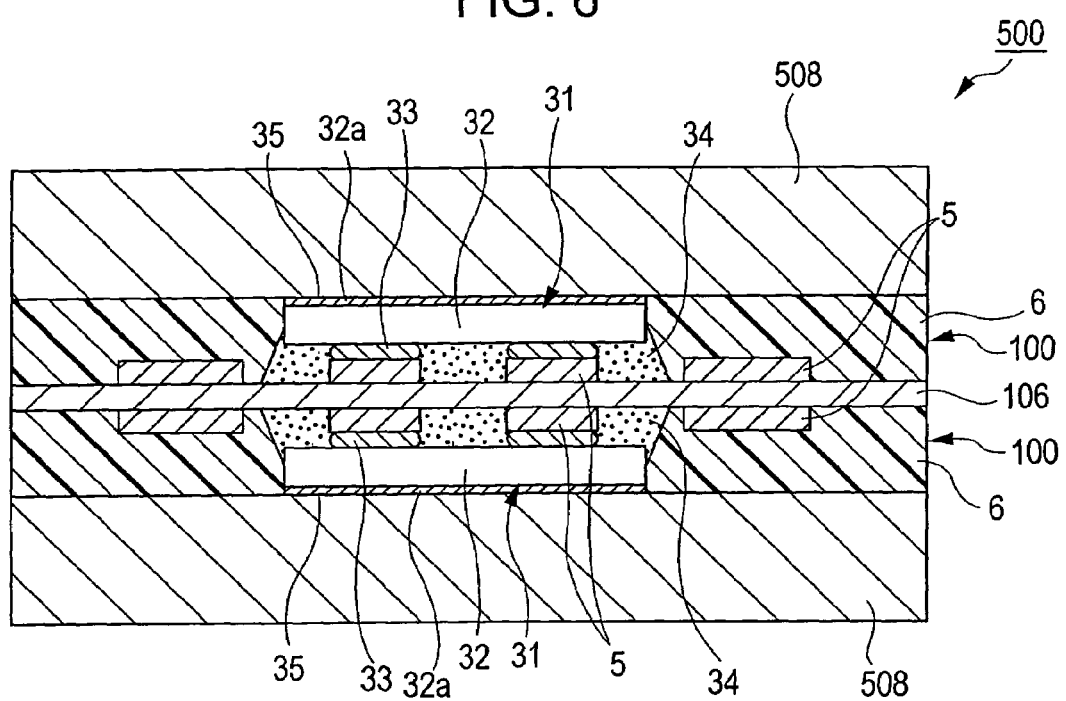
FIG. 6 is a schematic sectional view of an electronic circuit device according to a third embodiment of the present invention.

FIG. 6 is a schematic sectional view of an electronic circuit device 500 according to a third embodiment. This electronic circuit device 500 includes the circuit component modules 100 of the first embodiment, and the first resin films 6 of the circuit component modules 100 are opposed to each other with the second resin film 106 therebetween. These resin films are bonded together to be integrated. Each circuit component module 100 has a heat-releasing plate 508 with a thickness of about 20 to 500 μm, doubling as an armoring plate. The heat-releasing plate 508 is bonded to the heat-releasing portion 32a of the power IC 31 with a thermally conductive adhesive 35.

The electronic circuit device 500 has the heat-releasing plates 508 doubling as the armoring plates that block external radio waves for signals transmitted through the wiring pattern 5 or a radiated electromagnetic field of the signals. In the electronic circuit device 500, the heat-releasing plates 508, the first and second resin films 6 and 106, and the power ICs 31 are disposed with a high mutual dimensional precision, so that the electronic circuit device 500 can exhibit its designed performance in use as a high-frequency module.

Fourth Embodiment

Figure 7A:
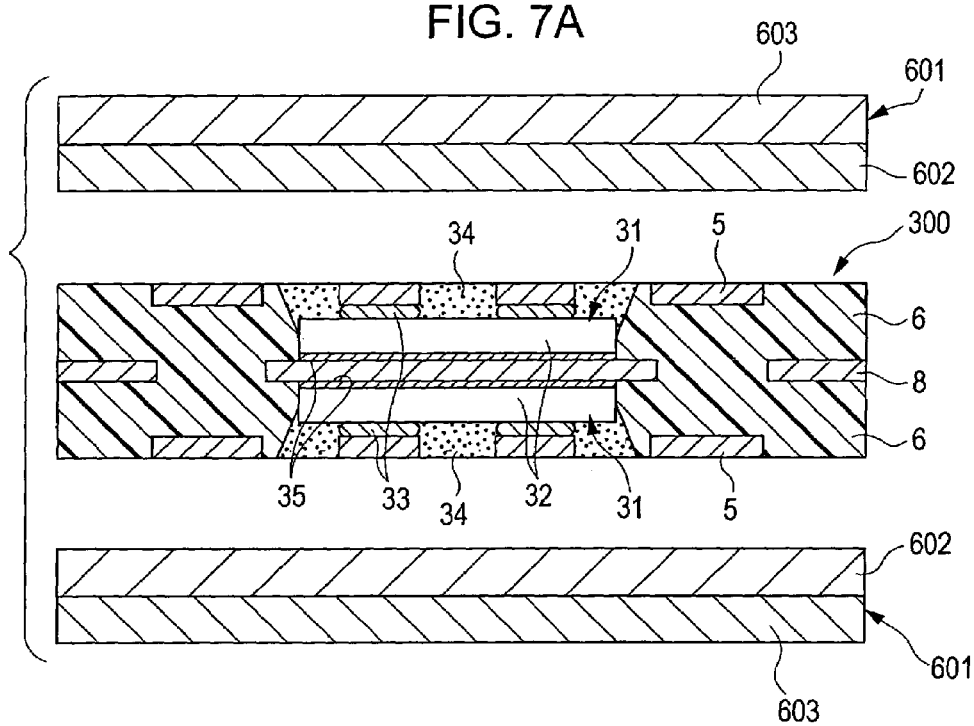
FIGS. 7A and 7B are schematic sectional views illustrating a process for manufacturing an electronic circuit device according to a fourth embodiment of the present invention.
Figure 7B:
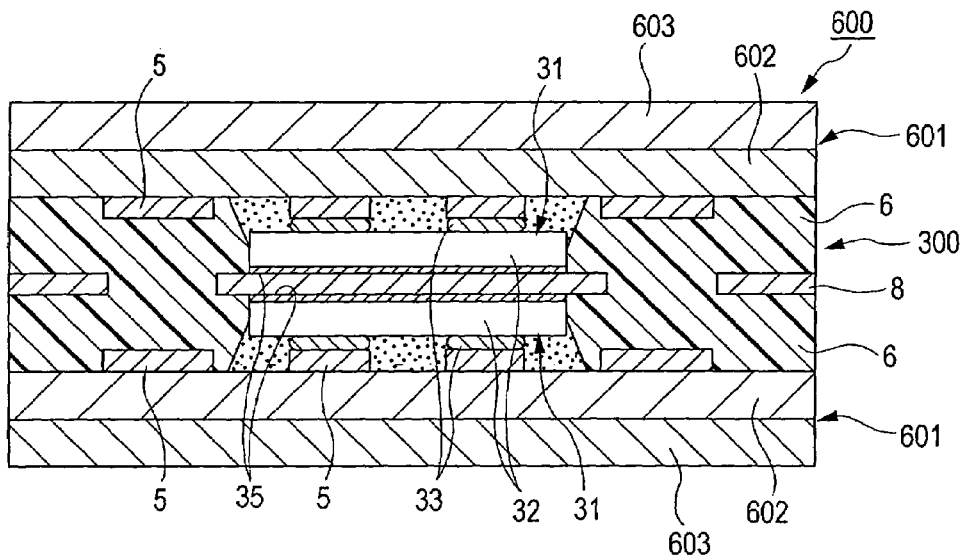

FIGS. 7A and 7B show an electronic circuit device and its manufacturing method according to a fourth embodiment of the present invention. As shown in FIG. 7A, the electronic circuit device 600 includes the circuit component module unit 300 according to the second embodiment and armoring plates 601 each having a dielectric layer 602. The dielectric layer 602 is opposed to the circuit component module unit 300. The armoring plate 601 includes the dielectric layer 602 and an armoring cover 603. Turning to FIG. 7B, the armoring plates 601 and the circuit component module 300 are stacked together and heat-pressed. Each first resin film 6 of the circuit component module unit 300 and the corresponding dielectric layer 602 are bonded together to be integrated, by the heat press. The dielectric layer 602 is a dielectric made of an epoxy resin, a polyester resin, or the like with a thickness of about 20 to 250 μm. The thickness of the dielectric layer 602 determines the distance between the circuit component module unit 300 and the armoring cover 603. The armoring cover 603 is a metal plate, such as Al, with a thickness of about 200 μm, and is used as a grounding terminal of the electronic circuit device 600.

In the electronic circuit device 600, the distances from the armoring cover 603 doubling as the grounding terminal to the power IC 31 and to the wiring pattern 5 can be controlled by varying the thickness of the dielectric layer 602 between the armoring covers 603 and the resin film 6. Accordingly, the electronic circuit device can exhibit its designed performance, particularly in use as a high-frequency module.

Figure 8A:
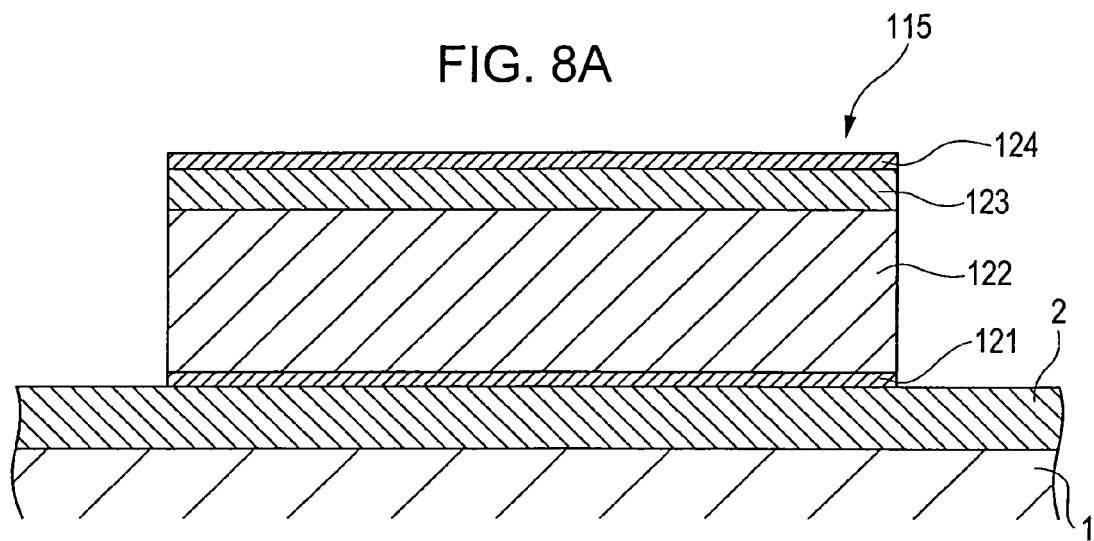
FIGS. 8A and 8B are schematic sectional views of wiring patterns according to other embodiments of the present invention.
Figure 8B:
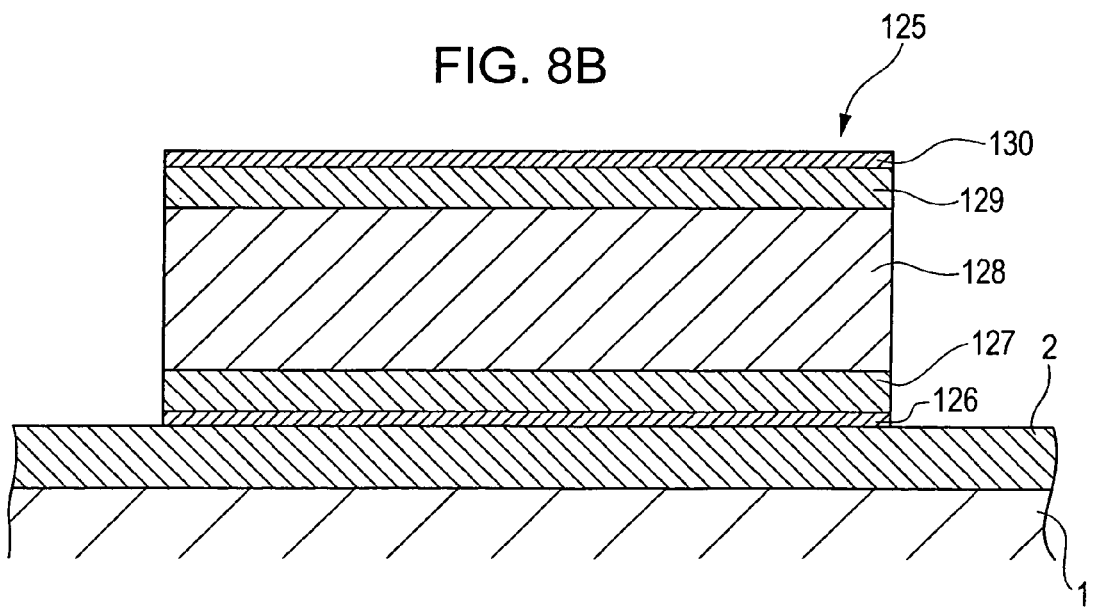

While the present invention has been described herein using the above preferred embodiments, it will be readily appreciated by those skilled in the art that various modifications in form and detail may be made without departing from the scope of the invention. For example, while the wiring pattern is formed of a Cu single layer in the above-described embodiments, the wiring pattern may have a multilayer structure composed of a plurality of metal layers, like the wiring pattern 115 shown in FIG. 8A. The wiring pattern 115 includes a Au layer 121, a Cu layer 122, a Ni layer 123, and a Au layer 124 that are deposited in that order on the seed layer 2. The wiring pattern 115 thus has the Au layers 121 and 124 on the respective sides in the thickness direction of the composite of the Cu layer 122 and the Ni layer 123. The Au layer 121 preferably has a thickness of 0.01 to 0.1 μm, the Cu layer 122 preferably has a thickness of 5 to 10 μm, the Ni layer 123 preferably has a thickness of 2 to 4 μm, and the other Au layer 124 preferably has a thickness of 0.1 to 0.5 μm. More specifically, the thicknesses are, preferably, 0.03 μm for the Au layer 121, 10 μm for the Cu layer 122, 2 μm for the Ni layer 123, and 0.2 μm for the other Au layer 124. These layers are formed by electroplating. The multilayer structure of the wiring pattern is not limited to the form shown in FIG. 8A. For example, the multilayer structure may be composed of five layers of, for example, a Au layer 126, a Ni layer 127, a Cu layer, 128, a Ni layer 129, and a Au layer 130, like the wiring pattern 125 shown in FIG. 8B.

Such a multilayer wiring pattern can include a Ni layer, which has a relatively high strength, so that the wiring pattern is prevented from being deformed by the stress placed on the wiring pattern when the electronic component is embedded in the resin film. Also, the external surface of the wiring pattern can be defined by a Au layer, so that the contact resistance between the electronic component and the wiring pattern can be reduced to enhance the reliability of their connection.

What is claimed is:

1. An electronic circuit device comprising:
   two circuit component modules, each circuit component module including:
      a first resin film;
      a heat-releasing plate stacked on a first surface of the first resin film;
      an electronic component embedded in the first resin film, the electronic component partially in contact with the heat-releasing plate; and
      a wiring pattern embedded in a second surface of the first resin film opposite the first surface, the wiring pattern forming a circuit in combination with the electronic component; and
   a second resin film,
   wherein the second surfaces of the first resin films of the circuit component modules oppose each other with the second resin film therebetween, and the first resin films and the second resin film resin films are bonded together to be integrated, and
   wherein the heat-releasing plates serve as armoring covers and grounding terminals.

2. The electronic circuit device according to claim 1, wherein:
   a first surface of the electronic component includes a heat-releasing portion exposed to a surface of the heat-releasing plate; and
   a second surface of the electronic component opposite the first surface of the electronic component includes a terminal connected to the wiring pattern.

3. The electronic circuit device according to claim 2, wherein the heat-releasing portion of the electronic component and the heat-releasing plate are joined to each other with a thermally conductive adhesive therebetween.

4. The electronic circuit device according to claim 1, wherein the first resin film includes at least one through-hole, said through-hole filled with an electroconductive paste to form an electrode, said electrode connected to the wiring pattern.

5. The electronic circuit device according to claim 4, wherein the heat-releasing plate has at least one pass-through hole through which the electrode extends.

6. The electronic circuit device according to claim 1, wherein the electronic component is a power IC.

7. A circuit component module unit comprising:
   a resin film;
   a heat-releasing plate embedded within the resin film;
   a first electronic component embedded in the resin film, the first electronic component partially in contact with a first surface of the heat-releasing plate;
   a first wiring pattern embedded on a first surface of the resin film, the first wiring pattern forming a circuit in combination with the first electronic component;
   a second electronic component embedded in the resin film, the second electronic component partially in contact with a second surface of the heat-releasing plate opposite the first surface of the heat releasing plate; and
   a second wiring pattern embedded on a second surface of the resin film opposite the first surface of the resin film, the second wiring pattern forming a circuit in combination with the second electronic component.

8. An electronic circuit device comprising:
   the circuit component module unit as set forth in claim 7;
   dielectric layers formed on the respective outer surfaces of the first resin films; and
   armoring covers disposed on the respective outer surfaces of the dielectric layers, the armoring covers doubling as grounding terminals.

9. The circuit component module unit according to claim 7, wherein:
   a first surface of the first electronic component includes a first heat-releasing portion coupled to the first surface of the heat-releasing plate;
   a second surface of the first electronic component opposite the first surface of the first electronic component includes a terminal connected to the first wiring pattern;
   a first surface of the second electronic component includes a second heat-releasing portion coupled to the second surface of the heat-releasing plate; and
   a second surface of the second electronic component opposite the first surface of the second electronic component includes a terminal connected to the second wiring pattern.

10. The circuit component module unit according to claim 9, wherein:
    the heat-releasing portion of the first electronic component and the heat-releasing plate are joined to each other with a first thermally conductive adhesive therebetween; and
    the heat-releasing portion of the second electronic component and the heat-releasing plate are joined to each other with a second thermally conductive adhesive therebetween.

11. The circuit component module unit according to claim 7, wherein the first and second wiring patterns are not connected to the heat-releasing plate.

12. The circuit component module unit according to claim 7, wherein the resin film includes at least one through-hole, said through-hole filled with an electroconductive paste to form an electrode, said electrode connected to the wiring pattern.

13. The circuit component module unit according to claim 12, wherein the heat-releasing plate has at least one pass-through hole through which the electrode extends.

14. The circuit component module unit according to claim 7, wherein the electronic component is a power IC.

* * * * *